(12) United States Patent
Yamaguchi et al.

(10) Patent No.: US 8,937,246 B2
(45) Date of Patent: Jan. 20, 2015

(54) GASKET AND ELECTRONIC DEVICE

(71) Applicant: Fujitsu Limited, Kawasaki-shi, Kanagawa (JP)

(72) Inventors: Shingo Yamaguchi, Kawasaki (JP); Satoshi Watanabe, Setagaya (JP)

(73) Assignee: Fujitsu Limited, Kawasaki (JP)

( * ) Notice: Subject to any disclaimer, the term of this patent is extended or adjusted under 35 U.S.C. 154(b) by 178 days.

(21) Appl. No.: 13/664,589

(22) Filed: Oct. 31, 2012

(65) Prior Publication Data

US 2013/0146323 A1 Jun. 13, 2013

(30) Foreign Application Priority Data

Dec. 7, 2011 (JP) ................................ 2011-268095

(51) Int. Cl.
 *H05K 5/03* (2006.01)
(52) U.S. Cl.
 USPC ............ 174/50.5; 174/50; 439/535; 248/906; 361/679.01
(58) Field of Classification Search
 CPC ............................... H05K 5/061; F16J 15/062
 USPC .................... 174/50; 439/535; 220/4.02, 378; 248/906; 361/679.01; 277/630
 See application file for complete search history.

(56) References Cited

U.S. PATENT DOCUMENTS

| 8,164,899 B2* | 4/2012 | Yamaguchi et al. ...... 361/679.55 |
| 2006/0231282 A1* | 10/2006 | Greenfield ...................... 174/67 |
| 2008/0150240 A1 | 6/2008 | Isono et al. |

FOREIGN PATENT DOCUMENTS

| JP | 2000-313050 A | 11/2000 |
| JP | 2004-060688 A | 2/2004 |
| WO | WO 2006/087948 A1 | 8/2006 |

* cited by examiner

*Primary Examiner* — Dhirubhai R Patel
(74) *Attorney, Agent, or Firm* — Squire Patton Boggs (US) LLP

(57) ABSTRACT

A gasket includes a first body which is attached to a first member at outside of a gap between a first seal surface formed on the first member and a second seal surface formed on a second member and which includes a reinforcing member; a second body which is extended from the first body to the gap between the first seal surface and the second seal surface; and a protrusion portion which is protruded toward the second seal surface in a state in which the first body is attached to the first member and the second member has not yet been attached to the first member, and is pressed by the second seal surface to closely attach the second body to the first seal surface in a state in which the first body is attached to the first member and the second member is attached to the first member.

10 Claims, 11 Drawing Sheets

GASKET AND ELECTRONIC DEVICE

CROSS-REFERENCE TO RELATED APPLICATION(S)

This application is based upon and claims the benefit of priority of the prior Japanese Patent Application No. 2011-268095, filed on Dec. 7, 2011, the entire contents of which are incorporated herein by reference.

FIELD

The embodiment discussed herein is related to a gasket and an electronic device.

BACKGROUND

Conventionally, a sealing structure including a metal cover, a base having a side panel facing a side panel of the cover, and a rubber gasket which is provided on the side panel of the cover by integral molding and closely attached to the side panel of the base is known.

As examples of related art, International Publication Pamphlet No. WO2006/087948, Japanese Laid-open Patent Publication No. 2004-60688, and Japanese Laid-open Patent Publication No. 2000-313050 are disclosed.

SUMMARY

According to an aspect of the invention, a gasket includes a first body which is attached to a first member at outside of a gap between a first seal surface formed on the first member and a second seal surface formed on a second member and which includes a reinforcing member; a second body which is extended from the first body to the gap between the first seal surface and the second seal surface; and a protrusion portion which is protruded toward the second seal surface in a state in which the first body is attached to the first member and the second member has not yet been attached to the first member, and is pressed by the second seal surface to closely attach the second body to the first seal surface in a state in which the first body is attached to the first member and the second member is attached to the first member.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Hereinafter, an embodiment of a technique disclosed by the present application will be described in detail with reference to the drawings.

Figure 1:
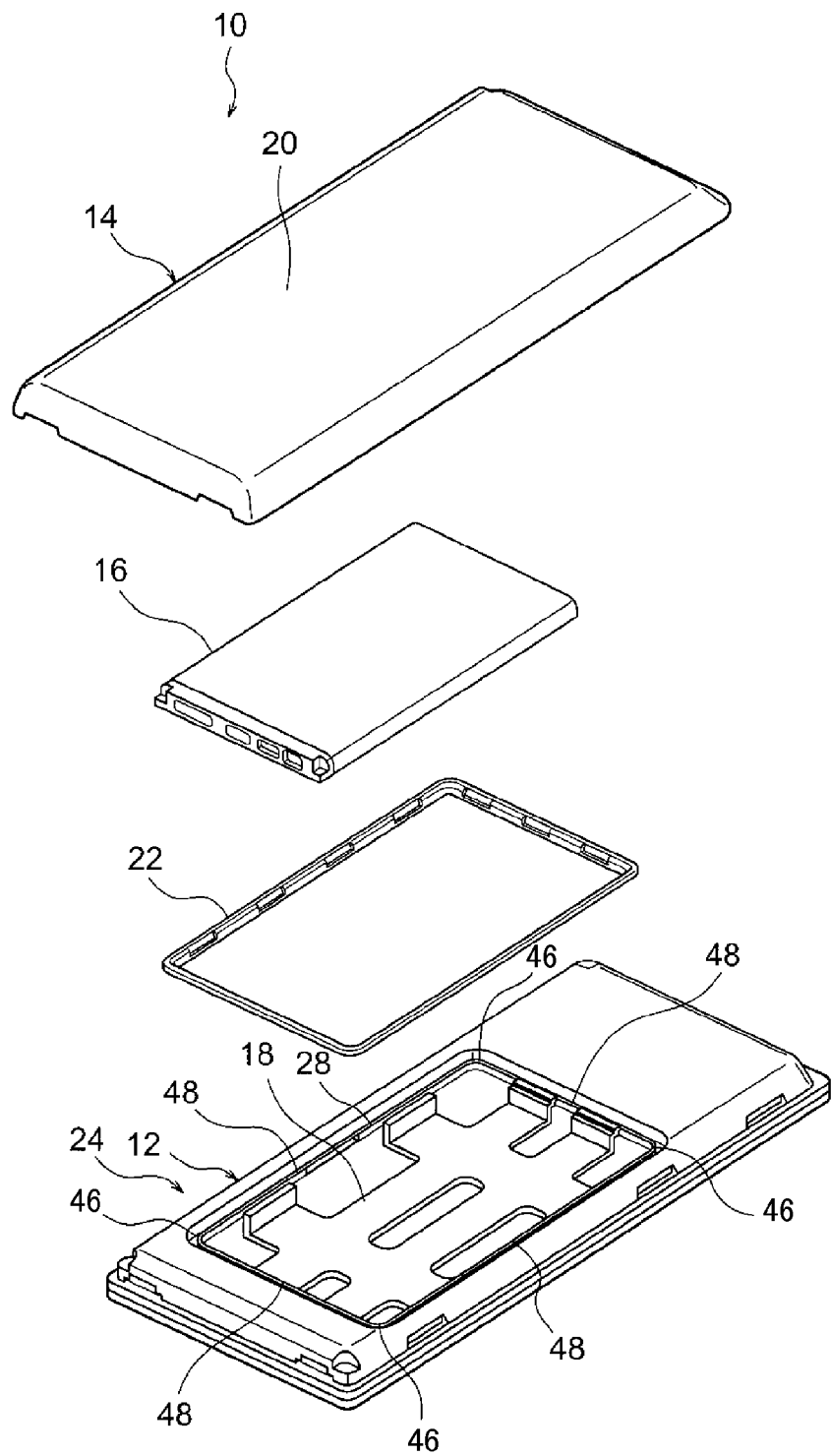
FIG. 1 is an exploded perspective view of an electronic device to which a waterproof structure according to an embodiment is applied.

FIG. 1 is an exploded perspective view of an electronic device to which a waterproof structure according to an embodiment is applied. As illustrated in FIG. 1, the electronic device 10 includes a case 12, a cover 14, and a battery 16. The case 12 and the cover 14 form a housing of the electronic device 10. A concave-shaped container portion 18 is formed in the case 12. A flat plate-shaped cover main body 20 which closes the opening of the container portion 18 is formed in the cover 14.

Figure 2:
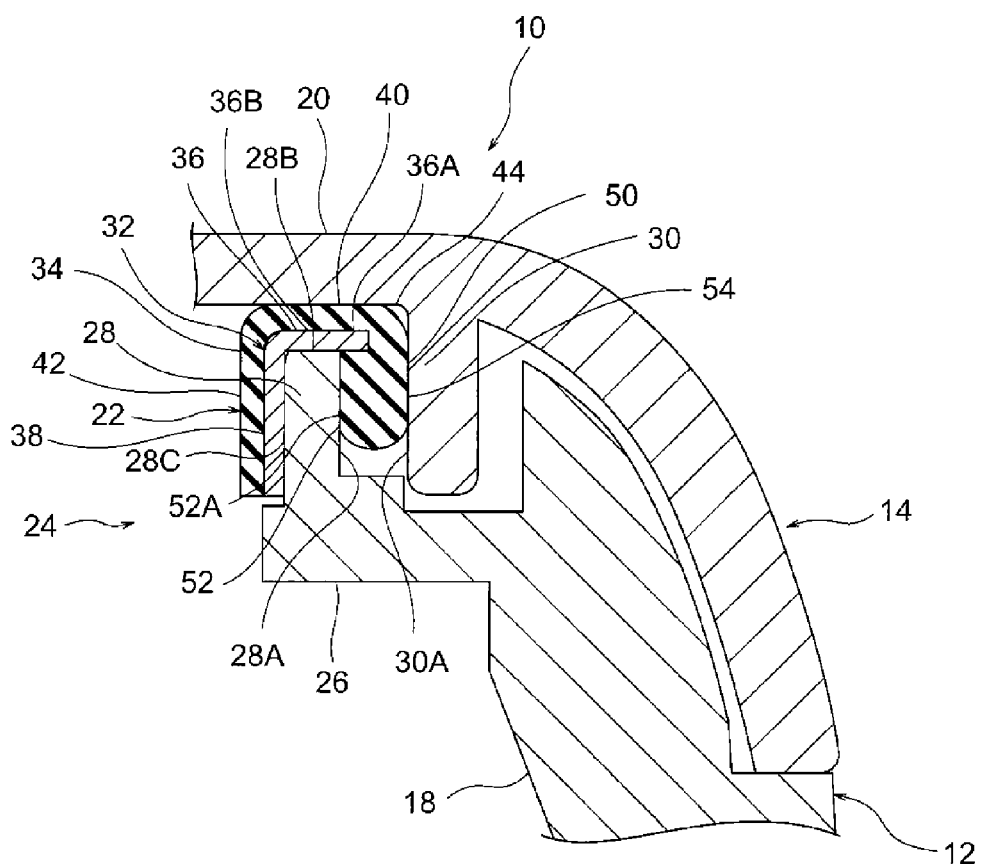
FIG. 2 is a cross-sectional view of the electronic device according to the embodiment.

The battery 16 is housed in the container portion 18. The cover 14 is attached to the case 12. As illustrated in FIG. 2, when the cover 14 is attached to the case 12, a gap is formed between the case 12 and the cover 14. Therefore, a waterproof structure 24 including a gasket 22 is applied to the electronic device 10 so that water does not infiltrate into the electronic device 10 through the gap.

FIG. 2 is a cross-sectional view of the electronic device according to the embodiment. As illustrated in FIG. 2, an extension portion 26 extending inside of the container portion 18 is formed around the edge of the opening of the container portion 18. A first wall portion 28 extending toward the cover main body 20 is formed at the tip portion of the extension portion 26. The first wall portion 28 and the extension portion 26 are formed in a ring shape along the edge of the opening of the container portion 18. The outer circumferential surface of the first wall portion 28 is a first seal surface 28A. The first seal surface 28A extends along the height direction of the first wall portion 28 and is formed into a flat surface shape in a cross-sectional view.

Figure 3:
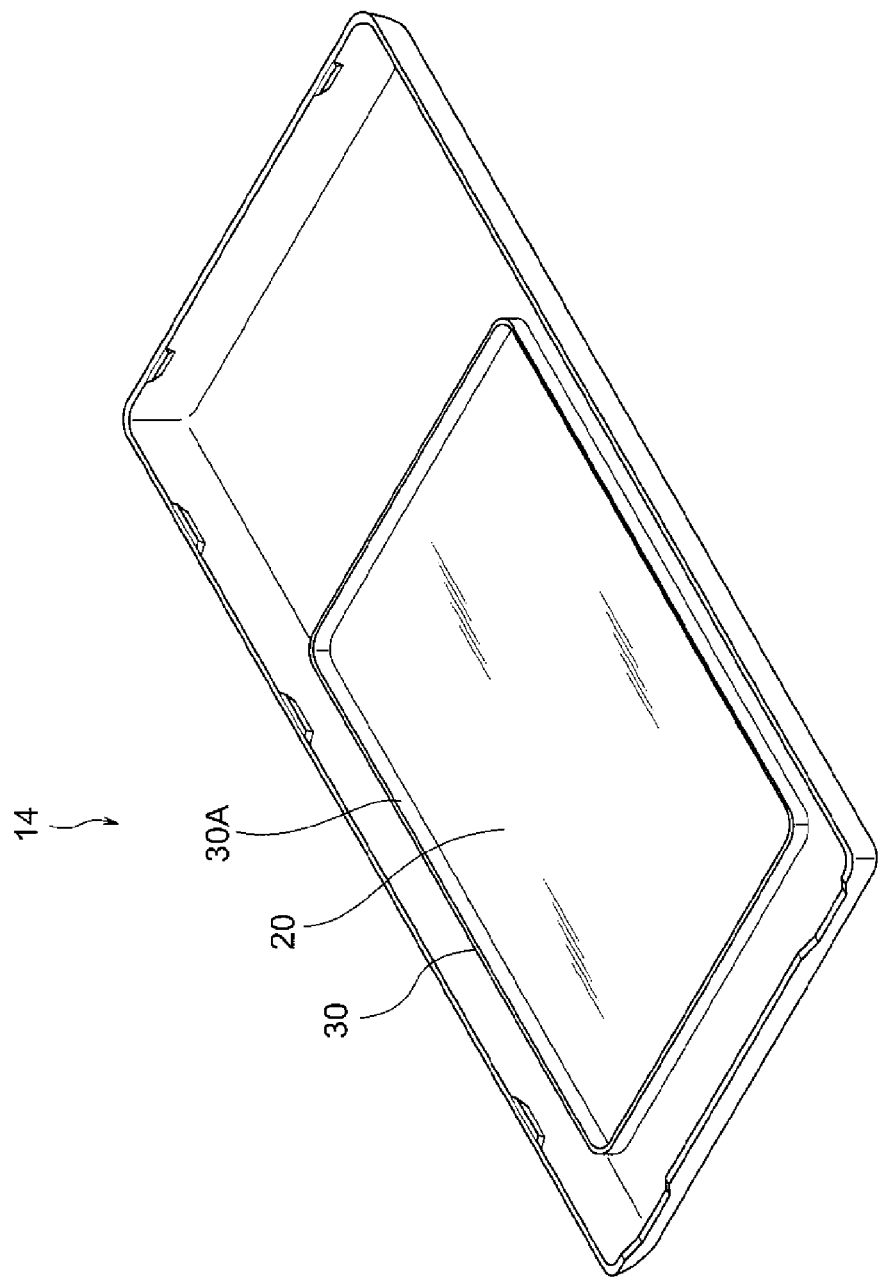
FIG. 3 is a perspective view of a cover according to the embodiment.

On the other hand, a second wall portion 30 extending to the side of the extension portion 26 is formed on the cover main body 20. FIG. 3 is a perspective view of the cover according to the embodiment. As illustrated in FIG. 3, the second wall portion 30 is formed in a ring shape to surround the outside of the first wall portion 28. The inner circumferential surface of the second wall portion 30 is a second seal surface 30A. The second seal surface 30A extends along the height direction of the second wall portion 30 and is formed into a flat surface shape in a cross-sectional view. The second seal surface 30A and the first seal surface 28A face each other with a distance between them.

The case 12 is an example of a first member. The cover 14 is an example of a second member. The first wall portion 28 is an example of a wall portion including a first seal surface.

The gasket 22 includes a reinforcing member 32 formed of metal or resin and a rubber portion 34. The rubber portion 34 is formed of, for example, a synthetic rubber. The reinforcing member 32 is integrated with the rubber portion 34 by, for example, insert molding. The reinforcing member 32 includes a first reinforcing portion 36 disposed along an edge surface 28B in the height direction of the first wall portion 28 and a second reinforcing portion 38 which is bent with respect to the first reinforcing portion 36 and disposed along a surface (inner circumferential surface 28C) opposite to the first seal surface 28A of the first wall portion 28.

One portion 36A of the first reinforcing portion 36 is protruded toward the second seal surface 30A with respect to the first seal surface 28A. The other portion 36B of the first reinforcing portion 36 is in contact with the edge surface 28B of the first wall portion 28. The first reinforcing portion 36 is an example of a reinforcing portion in which one portion is protruded from the first seal surface toward the second seal surface. The length of the second reinforcing portion 38 in the height direction of the first wall portion 28 is formed to be longer than that of a seal portion 50.

The first reinforcing portion 36 is covered by a first covering portion 40 of the rubber portion 34 from the side opposite to the edge surface 28B of the first wall portion 28. The second reinforcing portion 38 is covered by a second covering portion 42 of the rubber portion 34 from the side opposite to the inner circumferential surface 28C of the first wall portion 28. When the cover 14 is attached to the case 12, the first covering portion 40 is closely attached to the cover main body 20. The first reinforcing portion 36, the second reinforcing portion 38, the first covering portion 40, and the second covering portion 42 form a gasket main body 44.

The gasket main body 44 is formed in a ring shape along the first wall portion 28. The gasket main body 44 is attached to the case 12 (the first wall portion 28) at the outside of a gap between the first seal surface 28A and the second seal surface 30A. Specifically, the first reinforcing portion 36 and the first covering portion 40 of the gasket main body 44 are attached to the edge surface 28B of the first wall portion 28. The second reinforcing portion 38 and the second covering portion 42 of the gasket main body 44 are attached to the inner circumferential surface 28C of the first wall portion 28.

The reinforcing member 32 included in the gasket main body 44 may be formed in a ring shape along the first wall portion 28 illustrated in FIG. 1. The reinforcing member 32 may be provided to only linear portions 48 except for corner portions 46 of the first wall portion 28.

The seal portion 50 that seals between the first seal surface 28A and the second seal surface 30A is formed in the rubber portion 34 of the gasket 22. The seal portion 50 has a tongue-shaped seal portion main body 52 extending from the gasket main body 44 to the gap between the first seal surface 28A and the second seal surface 30A.

Figure 4:
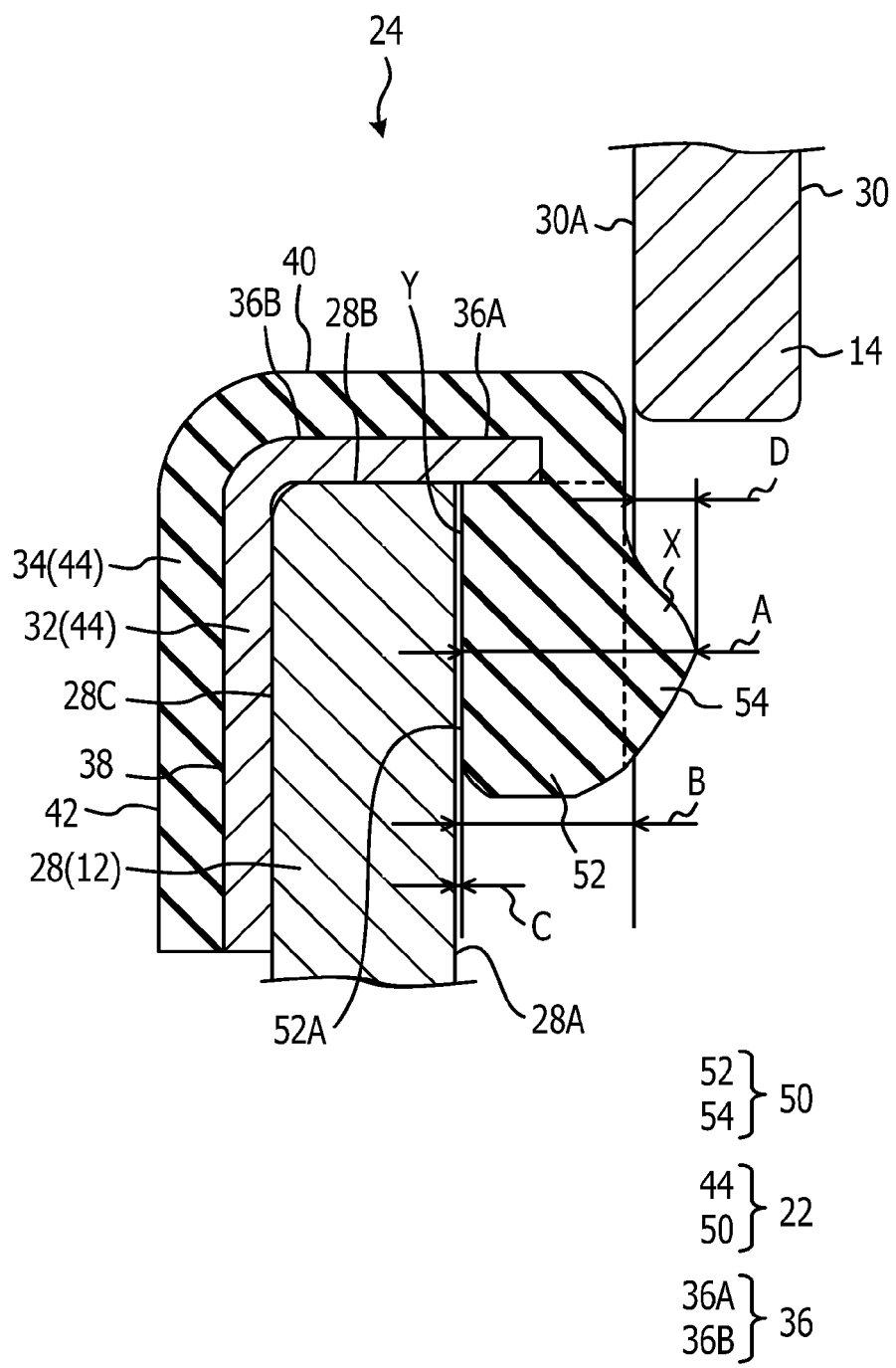
FIG. 4 is a cross-sectional view of the waterproof structure according to the embodiment.

FIG. 4 is a cross-sectional view of the waterproof structure according to the embodiment. As illustrated in FIG. 4, in a state in which the gasket main body 44 is attached to the first wall portion 28 (the case 12) and the cover 14 has not yet been attached to the case 12, the seal portion main body 52 is formed to face the first seal surface 28A with a distance from the first seal surface 28A.

A protrusion portion 54 protruding toward the second seal surface 30A (opposite to the first seal surface 28A) is formed in a portion nearer to the tip portion than a base end portion in the seal portion main body 52. The protrusion portion 54 is formed into a mountain-like shape convex toward the second seal surface 30A. In other words, a contact surface of the protrusion portion 54 with the second seal surface 30A is a convex surface which approaches the second seal surface 30A in directions from the base end portion and the tip portion of the seal portion main body 52 to the top of the protrusion portion 54. The protrusion portion 54 is formed in the seal portion main body 52, so that a portion of the seal portion 50 near to the tip is thicker than the base end portion.

More specifically, each portion of the waterproof structure 24 is formed as described below. When the direction in which the first seal surface 28A and the second seal surface 30A face each other is defined as a thickness direction of the seal portion 50, the length A is a length of the seal portion 50 in the thickness direction at a portion where the top of the protrusion portion 54 is located before the seal portion 50 is pressed and deformed.

The length B is a length between the first seal surface 28A and the second seal surface 30A in a state in which the cover 14 is attached to the case 12. The length C is a length of a gap between the seal portion main body 52 and the first seal surface 28A at the portion where the top of the protrusion portion 54 is located in a state in which the gasket main body 44 is attached to the first wall portion 28 (the case 12) and the cover 14 has not yet been attached to the case 12.

The length D is a length of a thickness of a portion in which the protrusion portion 54 is interfered by the second seal surface 30A at the portion where the top of the protrusion portion 54 is located in a state in which the gasket main body 44 is attached to the first wall portion 28 and the cover 14 is attached to the case 12. The length D can be defined as the amount of compression of the protrusion portion 54 by the second seal surface 30A, and the length D can be obtained by A+C−B by using the lengths A to C described above.

The cross-sectional area X is a cross-sectional area of the portion in which the protrusion portion 54 is interfered by the second seal surface 30A as seen from a direction perpendicular to the direction in which the first seal surface 28A and the second seal surface 30A face each other and the direction in which the seal portion main body 52 extends (a direction perpendicular to the page). The cross-sectional area Y is a cross-sectional area of a gap between the seal portion main body 52 (more specifically, a flat opposite surface 52A facing the first seal surface 28A) and the first seal surface 28A as seen from the perpendicular direction described above.

When the lengths A to D and the cross-sectional areas X and Y are defined as described above, the waterproof structure 24 is set so that C<D and X>Y are satisfied.

Figure 5:
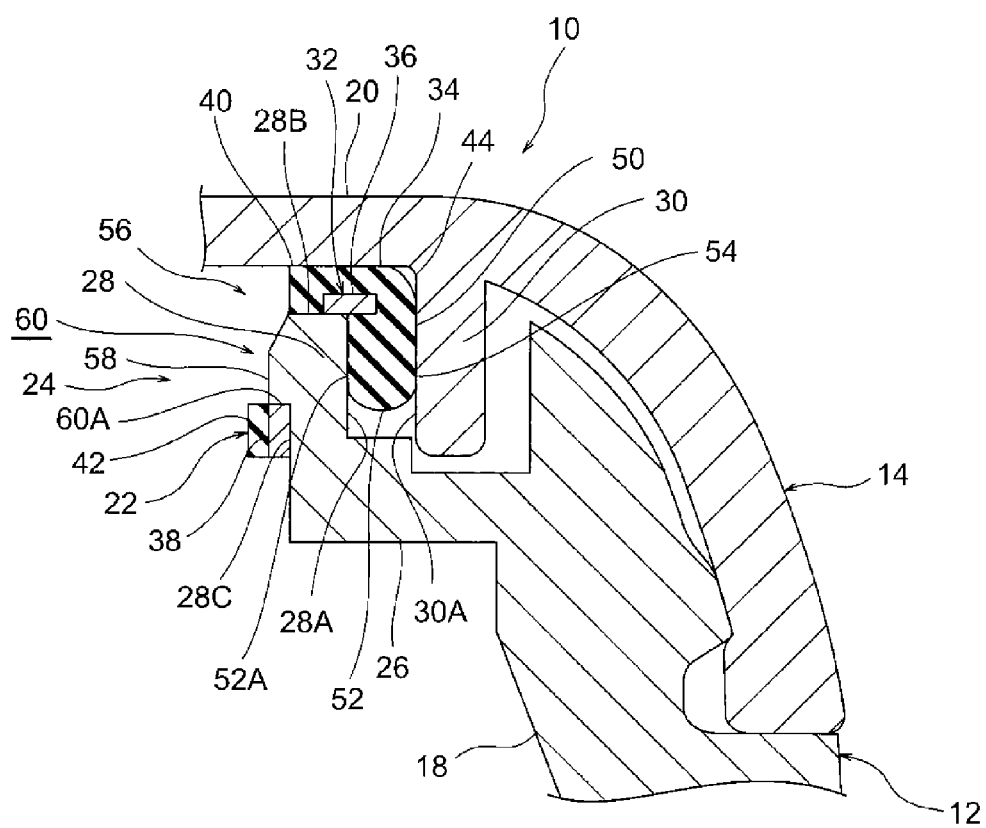
FIG. 5 is a cross-sectional view of the electronic device at a position different from that in FIG. 2.
Figure 6:
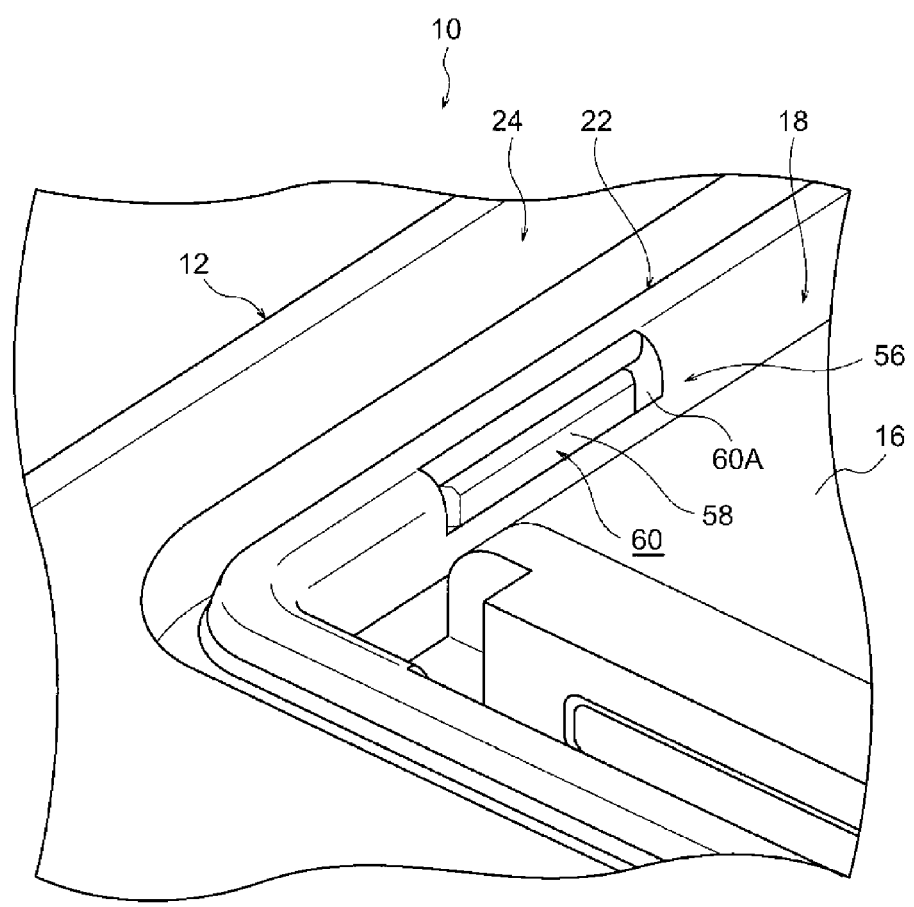
FIG. 6 is a perspective view of a fixing structure for fixing a gasket.

FIG. 5 is a cross-sectional view of the electronic device at a position different from that in FIG. 2. FIG. 6 is a perspective view of a fixing structure for fixing the gasket. As illustrated in FIGS. 5 and 6, the electronic device 10 includes the fixing structure 56 for fixing the gasket 22. The fixing structure 56 includes a claw portion 58 formed on the case 12 (the first wall portion 28) and a hole portion 60 formed in the gasket main body 44. The claw portion 58 is formed to protrude from the inner circumferential surface 28C of the first wall portion 28 and is fitted to the inner circumferential surface 60A of the hole potion 60.

The claw portion 58 is fitted to the inner circumferential surface 60A of the hole potion 60, so that the gasket main body 44 is fixed to the first wall portion 28. A plurality of fixing structures 56 are formed in the circumferential direction of the first wall portion 28 with a distance from each other. The claw portion 58 is an example of a fitting portion and the inner circumferential surface 60A of the hole potion 60 is an example of a fitted portion.

Next, a method of fixing the gasket 22 will be described.

Figure 7:
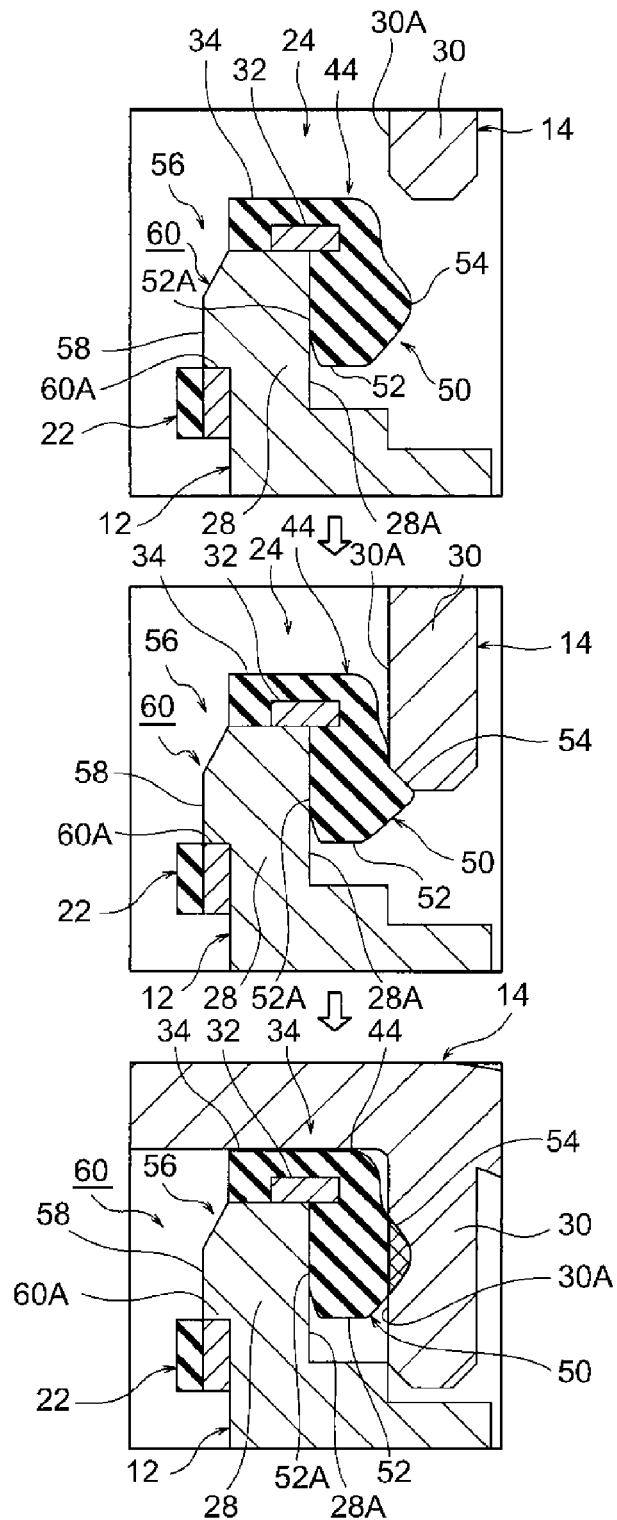
FIG. 7 is a diagram for explaining a method for fixing the gasket.

First, as illustrated in the upper diagram of FIG. 7, the gasket 22 is brought close to the case 12 so that the seal portion 50 is slid from the edge surface 28B of the first wall portion 28 along the height direction of the first wall portion 28. At this time, the seal portion main body 52 is formed with a gap from the first seal surface 28A. Therefore, slide (friction) between the seal portion main body 52 and the first seal surface 28A is avoided.

The claw portion 58 is fitted to the inner circumferential surface 60A of the hole potion 60 and the gasket main body 44 is attached to the case 12. In this state, the protrusion portion 54 protrudes toward the second seal surface 30A from a portion nearer to the tip portion than the base end portion in the seal portion main body 52.

Subsequently, as illustrated in the middle diagram of FIG. 7, the cover 14 is brought close to the case 12 so that the second wall portion 30 is slid from the side of the edge surface 28B of the first wall portion 28 along the height direction of the first wall portion 28. At this time, the tip portion of the second wall portion 30 comes into contact with the protrusion portion 54 and slides on the protrusion portion 54, so that the protrusion portion 54 is gradually pressed and deformed (compressed) toward the first seal surface 28A by the tip portion of the second wall portion 30.

As illustrated in the lower diagram of FIG. 7, in a state in which the gasket main body 44 is attached to the case 12 and the cover 14 is attached to the case 12, the protrusion portion 54 is pressed to the second seal surface 30A and closely attached to the second seal surface 30A. The protrusion portion 54 is pressed by the second seal surface 30A, so that the seal portion main body 52 is generally moved toward the first seal surface 28A and the seal portion main body 52 is closely attached to the first seal surface 28A.

Next, functions and effects of the embodiment will be described.

As described above in detail, in the embodiment, the reinforcing member 32 is provided in the gasket main body 44 as illustrated in FIGS. 2 and 4. Therefore, the shape of the gasket main body 44 is stabilized, so that the gasket 22 is easily attached to the case 12.

Further, in a state in which the gasket main body 44 is attached to the case 12 and the cover 14 has not yet been attached to the case 12 (see FIG. 4), the seal portion main body 52 is formed to face the first seal surface 28A with a distance from the first seal surface 28A. Therefore, when the gasket 22 is attached to the case 12, there is a gap between the seal portion main body 52 and the first seal surface 28A, so that slide between the seal portion main body 52 and the first seal surface 28A is avoided.

Thereby, the gasket 22 is more easily attached to the case 12 and the seal portion 50 is not twisted when the gasket 22 is attached to the case 12, so that it is possible to improve workability in attaching the gasket 22. Further, the seal portion 50 is not stretched in the circumferential direction when the gasket 22 is attached to the case 12, so that damage of the gasket 22 (for example, rupture or the like) caused when the gasket 22 is attached can be avoided.

When the gasket 22 is replaced, only the gasket 22 may be replaced and other members (for example, the cover 14) are not replaced. Therefore, it is possible to reduce the cost of replacing the gasket 22.

in a state in which the gasket main body 44 is attached to the case 12 and the cover 14 is attached to the case 12 (see FIG. 2), the protrusion portion 54 is pressed to the second seal surface 30A, so that the seal portion main body 52 is closely attached to the first seal surface 28A. Therefore, sealability between the first seal surface 28A and the second seal surface 30A can be ensured.

In particular, when the lengths A to D and the cross-sectional areas X and Y are defined as described above (see FIG. 4), the waterproof structure 24 is set so that C<D and X>Y are satisfied. Therefore, it is possible to more effectively seal between the first seal surface 28A and the second seal surface 30A.

The seal portion 50 is closely attached to the first seal surface 28A without being stretched in the circumferential direction, so that the cross-sectional area of the seal portion 50 is not reduced at corner portions of the first seal surface 28A. Thereby, the seal portion 50 can be closely attached to the first seal surface 28A by uniform pressure on the linear portions 48 and the corner portions 46 (see FIG. 1). Therefore, it is possible to reduce degradation of sealability at the corner portions 46 of the first wall portion 28.

As illustrated in FIG. 4, the reinforcing member 32 includes the first reinforcing portion 36 disposed along the edge surface 28B of the first wall portion 28 and the second reinforcing portion 38 which is bent with respect to the first reinforcing portion 36 and disposed along the inner circumferential surface 28C of the first wall portion 28. Therefore, the reinforcing member 32 is formed into an L shape, so that the rigidity of the reinforcing member 32 is improved. Thus, the attaching posture of the gasket 22 when the gasket 22 is attached to the case 12 can be stabilized.

In particular, the length of the second reinforcing portion 38 in the height direction of the first wall portion 28 is formed to be longer than that of the seal portion 50. The contact area between the second reinforcing portion 38 and the first wall portion 28 increases, so that it is possible to more stabilize the attaching posture of the gasket 22 when the gasket 22 is attached to the case 12.

One portion 36A of the first reinforcing portion 36 is protruded toward the second seal surface 30A with respect to the first seal surface 28A. Therefore, the supporting rigidity of the base end portion of the seal portion main body 52 extended from the gasket main body 44 to the gap between the first seal surface 28A and the second seal surface 30A is improved. When the cover 14 is attached to the case 12 in a state in which the gasket main body 44 is attached to the case 12, it is possible to more stably maintain the state in which the seal portion main body 52 and the first seal surface 28A face each other with a gap between them.

As illustrated in FIG. 5, the claw portion 58 formed on the first wall portion 28 is fitted to the inner circumferential surface 60A of the hole potion 60 formed in the gasket main body 44, so that the gasket main body 44 is fixed to the first wall portion 28. Thereby, it is possible to reduce the possibility that the gasket 22 falls from the case 12.

The gasket is not bonded to the case 12 to fix the gasket to the case 12, so that the gasket 22 can be easily replaced.

Next, modified examples of the embodiment will be described.

Although the gasket 22 and the waterproof structure 24 are applied to the electronic device 10 in the above embodiment, the gasket 22 and the waterproof structure 24 may be applied to devices other than the electronic device 10.

Although the first seal surface 28A and the second seal surface 30A are formed on the first wall portion 28 and the second wall portion 30, the first seal surface 28A and the second seal surface 30A may be formed on portions other than wall portions.

The hole potion 60 may be formed in the case 12 (the first wall portion 28) and the claw portion 58 may be formed on the gasket main body 44. In this case, the inner circumferential surface 60A of the hole potion 60 is an example of the fitting portion and the claw portion 58 is an example of the fitted portion.

Figure 8:
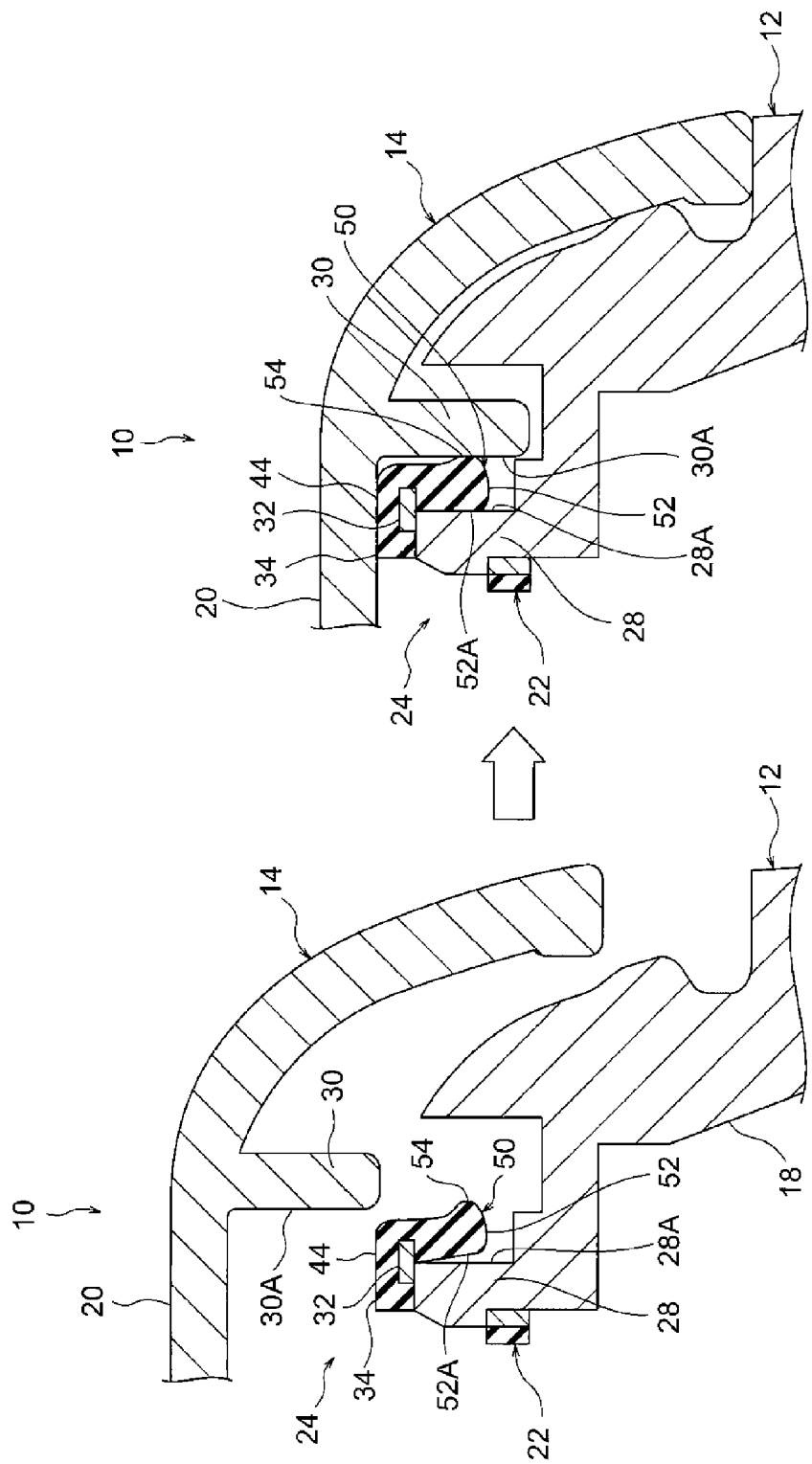
FIG. 8 is a diagram illustrating a first modified example of the waterproof structure according to the embodiment.

FIG. 8 is a diagram illustrating a first modified example of the waterproof structure according to the embodiment. The seal portion 50 may be formed as illustrated in FIG. 8. Specifically, the opposite surface 52A to the first seal surface 28A in the seal portion main body 52 is formed to be slanted so that the nearer to the tip portion of the seal portion main body 52, the farther from the first seal surface 28A.

When the seal portion 50 is formed as described above, the gap between the seal portion main body 52 and the first seal surface 28A at the tip portion of the seal portion main body 52 is larger than that at the base end portion of the seal portion main body 52. Therefore, the gasket 22 can be more easily attached to the case 12. In the first modified example, the protrusion portion 54 is pressed by the second seal surface 30A, so that the seal portion main body 52 is rotated around the base end portion toward the first seal surface 28A. Thereby, the seal portion main body 52 is closely attached to the first seal surface 28A.

Figure 9:
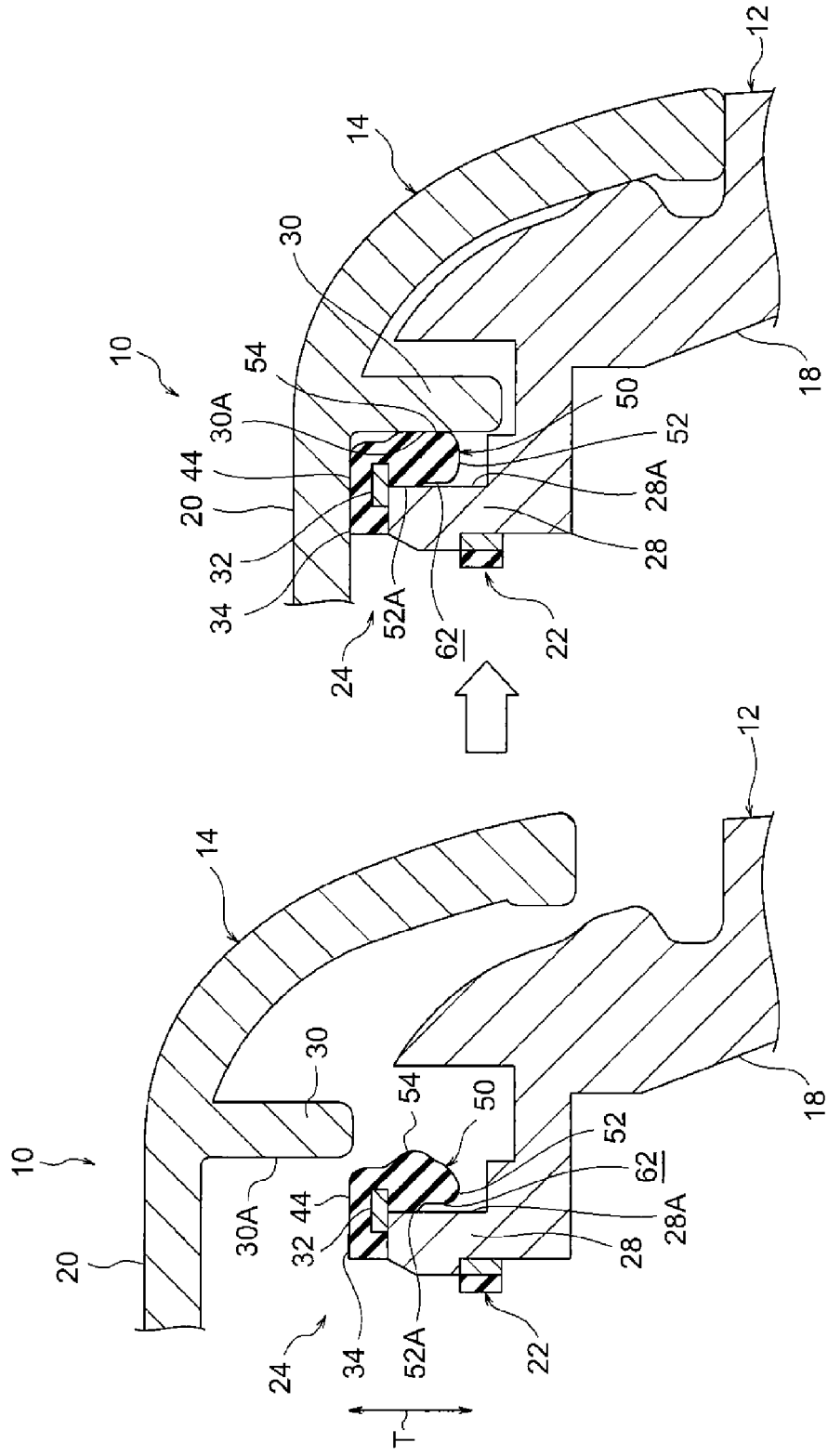
FIG. 9 is a diagram illustrating a second modified example of the waterproof structure according to the embodiment.

FIG. 9 is a diagram illustrating a second modified example of the waterproof structure according to the embodiment. The seal portion 50 may be formed as illustrated in FIG. 9. Specifically, in the seal portion main body 52, a notch 62 that opens toward the first seal surface 28A and the tip portion is formed at a portion nearer to the tip portion than the opposite surface 52A to the first seal surface 28A. The notch 62 is formed all over the circumferential direction of the seal portion main body 52. The protrusion portion 54 is formed in a position which overlaps the opposite surface 52A of the seal portion main body 52 and the extending direction of the seal portion main body 52 (the thickness direction of the electronic device 10, that is, the direction indicated by the arrow T).

When the seal portion 50 is formed as described above, the area of the opposite surface 52A is smaller than that in a case in which the opposite surface 52A is formed over the entire portion from the base end portion to the tip portion of the seal portion main body 52. Thereby, the pressure (surface pressure) from the seal portion main body (the opposite surface 52A) to the first seal surface 28A can be increased, so that it is possible to improve the sealability between the first seal surface 28A and the second seal surface 30A.

Figure 10:
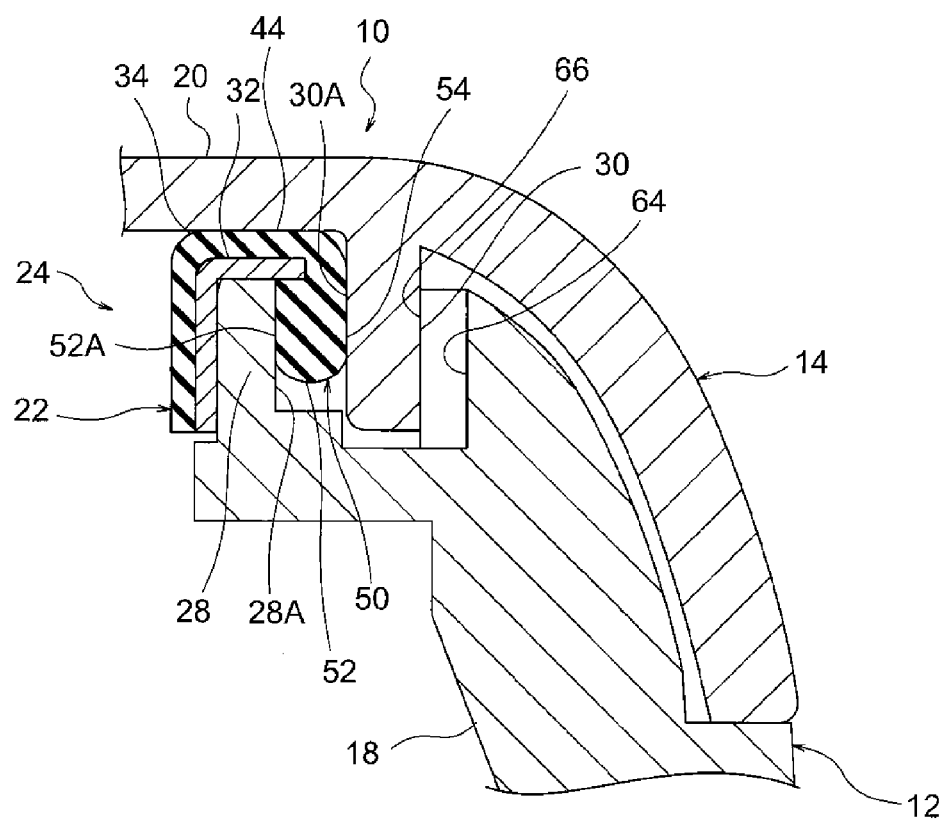
FIG. 10 is a diagram illustrating a third modified example of the waterproof structure according to the embodiment.

FIG. 10 is a diagram illustrating a third modified example of the waterproof structure according to the embodiment. As illustrated in FIG. 10, a wall portion 64 formed on the side opposite to the first wall portion 28 with respect to the second wall portion 30 may be connected to the second wall portion 30 by a rib 66. When the waterproof structure is formed as described above, it is possible to reduce the possibility that the second seal surface 30A leans to the wall portion 64, so that it is possible to ensure the sealability between the first seal surface 28A and the second seal surface 30A.

Figure 11:
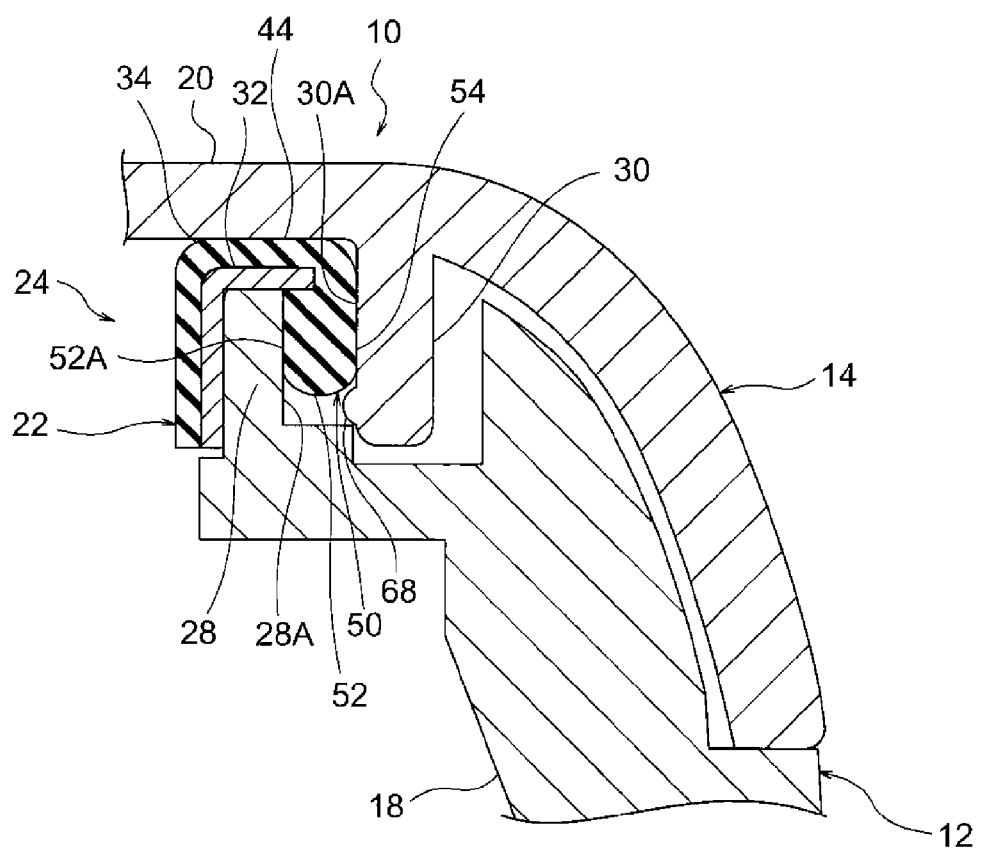
FIG. 11 is a diagram illustrating a fourth modified example of the waterproof structure according to the embodiment.

FIG. 11 is a diagram illustrating a fourth modified example of the waterproof structure according to the embodiment. As illustrated in FIG. 11, the second wall portion 30 is formed longer than the seal portion 50 in the height direction and a convex portion 68 protruding toward the first wall portion 28 may be formed at the tip portion of the second wall portion 30. When the waterproof structure is formed as described above, it is possible to reduce leakage from the second wall portion 30 to the seal portion 50 by the convex portion 68.

The plurality of modified examples can be arbitrarily combined and implemented.

Although an embodiment of the technique disclosed by the present application has been described, the technique disclosed by the present application is not limited to the embodiment described above, and, of course, in addition to the embodiment, the technique can be variously modified and implemented without departing from the scope of the embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A gasket comprising:
   a gasket main body which is attached to a case at outside of a gap between a first seal surface formed on the case and a second seal surface formed on a cover and facing the first seal surface with a distance from the first seal surface and which includes a reinforcing member, the reinforcing member contacting the case when the gasket main body is attached to the case, and the reinforcing member parting from the cover when the cover is attached to the case;
   a seal portion main body which is extended from the gasket main body to the gap between the first seal surface and the second seal surface, the seal portion main body being configured to face the first seal surface via a gap between the seal portion main body and the first seal surface, when the gasket main body is attached to the case and the cover is not attached to the case; and
   a protrusion portion which forms a seal portion along with the seal portion main body, the protrusion portion parting from the reinforcing member, the protrusion portion being protruded toward the second seal surface from a portion nearer to a tip portion than a base end portion in the seal portion main body, when the gasket main body is attached to the case and the cover is not attached to the case, and the protrusion portion being pressed by the second seal surface to closely attach the seal portion main body to the first seal surface, when the gasket main body is attached to the case and the cover is attached to the case.

2. The gasket according to claim 1, wherein
   when a direction in which the first seal surface and the second seal surface face each other is defined as a thickness direction of the seal portion, a length of the seal portion in the thickness direction at a portion where a top of the protrusion portion is located before the seal portion is pressed and deformed is defined as A,
   a length between the first seal surface and the second seal surface in a state in which the cover is attached to the case is defined as B,
   a length of a gap between the seal portion main body and the first seal surface at the portion where the top of the protrusion portion is located when the gasket main body is attached to the case and the cover is not attached to the case is defined as C,
   a length of a thickness of a portion in which the protrusion portion is interfered by the second seal surface at the portion where the top of the protrusion portion is located when the gasket main body is attached to the case and the cover is attached to the case is defined as D, wherein D=A+C−B,
   a cross-sectional area of the portion in which the protrusion portion is interfered by the second seal surface as seen from a direction perpendicular to the direction in which the first seal surface and the second seal surface face each other and a direction in which the seal portion main body extends is defined as X, and a cross-sectional area of a gap between the seal portion main body and the first seal surface as seen from the above perpendicular direction is defined as Y, C<D and X>Y are satisfied.

3. The gasket according to claim 1, wherein a surface on which the protrusion portion is in contact with the second seal surface is a convex surface which approaches the second seal surface in directions from the base end portion and the tip portion of the seal portion main body to the top of the protrusion portion.

4. The gasket according to claim 1, wherein an opposite surface to the first seal surface in the seal portion main body is formed so that the nearer to the tip portion of the seal portion main body, the farther from the first seal surface.

5. The gasket according to claim 1, wherein in the seal portion main body, a notch that opens toward the first seal surface and a tip portion is formed at a portion nearer to the tip portion than an opposite surface to the first seal surface.

6. An electronic device comprising:

a case including a first seal surface;

a cover attached to the case and including a second seal surface facing the first seal surface with a distance from the first seal surface; and a gasket attached to the case, wherein the gasket includes a gasket main body which is attached to the case at outside of a gap between the first seal surface and the second seal surface and which includes a reinforcing member, the reinforcing member contacting the case when the gasket main body is attached to the case, and the reinforcing member parting from the cover when the cover is attached to the case, a seal portion main body which is extended from the gasket main body to the gap between the first seal surface and the second seal surface, the seal portion main body being configured to face the first seal surface via a gap between the seal portion main body and the first seal surface, when the gasket main body is attached to the case and the cover is not attached to the case, and a protrusion portion which forms a seal portion along with the seal portion main body, the protrusion portion parting from the reinforcing member, the protrusion portion being protruded toward the second seal surface from a portion nearer to a tip portion than a base end portion in the seal portion main body when the gasket main body is attached to the case and the cover is not attached to the case and the protrusion portion being pressed by the second seal surface to closely attach the seal portion main body to the first seal surface, when the gasket main body is attached to the case and the cover is attached to the case.

7. The electronic device according to claim 6, wherein the case includes a wall portion including the first seal surface, and the reinforcing member includes a first reinforcing portion disposed along an edge surface in a height direction of the wall portion and a second reinforcing portion which is bent with respect to the first reinforcing portion and disposed along a surface opposite to the first seal surface of the wall portion.

8. The electronic device according to claim 6, wherein the case includes a wall portion including the first seal surface, and the reinforcing member includes a reinforcing portion which is disposed along an edge surface in a height direction of the wall portion and a part of which is protruded toward the second seal surface with respect to the first seal surface.

9. The electronic device according to claim 6, further comprising:

a fitting portion formed in the case; and a fitted portion which is formed on the gasket and fitted to the fitting portion.

10. The electronic device according to claim 6, wherein the case is a case including a container portion which houses a battery, and the cover is a cover which is attached to the case and closes an opening of the container portion.

* * * * *